(12) United States Patent
Choi et al.

(10) Patent No.: US 6,906,967 B2
(45) Date of Patent: Jun. 14, 2005

(54) NEGATIVE DROP VOLTAGE GENERATOR IN SEMICONDUCTOR MEMORY DEVICE AND METHOD OF CONTROLLING NEGATIVE VOLTAGE GENERATION

(75) Inventors: Jong-Hyun Choi, Suwon-si (KR); Young-Hun Seo, Susung-gu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/923,729

(22) Filed: Aug. 24, 2004

(65) Prior Publication Data

US 2005/0047221 A1 Mar. 3, 2005

(30) Foreign Application Priority Data

Aug. 25, 2003 (KR) .................................. 10-2003-0058576

(51) Int. Cl.[7] .................................................. G11C 7/00
(52) U.S. Cl. ................................... 365/189.09; 365/201
(58) Field of Search ............................. 365/189.09, 201, 365/241

(56) References Cited

U.S. PATENT DOCUMENTS 5,905,682 A * 5/1999 Gans et al. ................. 365/201
6,147,914 A * 11/2000 Leung et al. ........... 365/189.09
6,535,435 B2 * 3/2003 Tanaka et al. .......... 365/189.09
6,545,923 B2 * 4/2003 Sim et al. .................... 365/204
6,643,208 B2 * 11/2003 Yamagata et al. ........... 365/226

* cited by examiner

Primary Examiner—Vu A. Le
(74) Attorney, Agent, or Firm—Volentine Francos & Whitt PLLC

(57) ABSTRACT

In the negative drop voltage generating apparatus of a semiconductor memory device and the method of controlling a negative voltage generation. The apparatus generates a negative voltage having a level necessary for an operating mode in the semiconductor memory device. The apparatus includes a negative drop voltage generator having first and second output terminals and a voltage separated/integrated unit connected between the first and second output terminals of the negative drop voltage generator. The voltage separated/integrated unit performs a voltage separation and connection so that the negative voltages are generated with individually different levels or with the same level through the first and second output terminals, in response to an applied control signal.

16 Claims, 4 Drawing Sheets

NEGATIVE DROP VOLTAGE GENERATOR IN SEMICONDUCTOR MEMORY DEVICE AND METHOD OF CONTROLLING NEGATIVE VOLTAGE GENERATION

BACKGROUND OF THE INVENTION

1. Field of the Invention

Embodiments of the present invention relate to a negative drop voltage generator and a method of controlling negative voltage generation. This application claims priority under 35 U.S.C. §119 from Korean Patent Application 2003-58576, filed on Aug. 25, 2003, the contents of which are hereby incorporated by reference in their entirety.

2. Description of the Related Art

The development of volatile semiconductor memories (e.g. a dynamic random access memory (DRAM)) has increased the operating speed of the memories. Also, the development has decreased the chip size of the memories, increasing integration of the memories.

In a DRAM having a plurality of unit memory cells (each of which may include one access transistor and one storage capacitor), a bulk bias voltage generator may be employed to generate a substrate or bulk bias voltage. Since the bulk bias voltage (VBB) has a negative voltage level in relation to a power voltage (VDD), the bulk bias voltage generator is often referred to as a negative drop voltage generator.

There are at least three reasons why a bulk bias voltage (VBB) is supplied to a silicon substrate or bulk region. A first reason is to prevent a partial forward bias for a PN junction of circuit configurative devices within a semiconductor memory device (i.e. to prevent data loss or latch-up of memory cells). A second reason is to reduce a change of threshold voltage in a MOS (Metal Oxide Semiconductor) transistor through a back gate effect, to promote stabilization of the device. A third reason is to reduce the necessity for increasing a consistency of channel stop implant provided below a field oxide layer by increasing a threshold voltage of parasitic MOS transistors and to reduce a PN junction capacity of a MOS transistor by applying a reverse bias, to increase the operating speed.

In a DRAM, as one of several methods to increase a refresh performance, a negative word line drive scheme applies a negative word line voltage as a gate voltage during precharging. In the DRAM employing this driving scheme, a negative word line driving voltage VBB2 is also a bulk bias voltage VBB1. Accordingly, a single negative drop voltage generator may be employed to obtain the bulk bias voltage VBB1 and the word line driving negative voltage VBB2. Alternatively, individual negative drop voltage generators may be employed to independently obtain the bulk bias voltage VBB1 and the word line driving negative voltage VBB2.

Regardless of the bulk bias voltage and the word line driving negative voltage being generated by one negative drop voltage generator or independently through separate private-use negative drop voltage generators, it may be important to reduce ripple and generate a stabilized negative voltage by more efficiently controlling the negative drop voltage generator or generators, in order to accomplish improved performance of the semiconductor memory device.

An EDS (Electrical Die Sorting) test of semiconductor memory devices applies voltage stress or temperature stress higher than the actual use environment, during a predetermined time, in the semiconductor memory device. After the application of stress, an electrical characteristic of the semiconductor memory device is checked, and a chip involving a weak cell is screened. A determination is made, if a chip has a defect or a characteristic deviating from a normalized distribution.

In the EDS test, the bulk bias voltage VBB1 needs to be applied lower than a level of a bulk bias voltage VBB1 used in normal operation, in order for a severe test of the semiconductor memory device. In order to screen the chip under a worse condition in a tRDL (last data in to row precharge) test, concerning a refresh characteristic test, a bulk bias voltage VBB1 of a cell transistor (including a memory cell) is applied lower than a level of bulk bias voltage used in normal operation. The word line driving negative drop voltage generator may generate a negative voltage VBB2 having a level lower than the determined voltage level. In other words, when lowering the negative voltage VBB1 (generated in the negative drop voltage generator for use of bulk bias), there is a problem that the negative voltage VBB2 (which is lower than the predetermined voltage level) is generated together with the bulk bias voltage VBB1 by the word line driving negative drop voltage generator.

The bulk bias voltage VBB1 and the word line driving negative voltage VBB2 are substantially the same level in normal operating mode of the semiconductor memory device. However, in a memory test mode, the bulk bias voltage VBB1 and the word line driving negative voltage VBB2 are different levels from each other, in order to obtain test reliability. Accordingly, voltage generation for bulk bias voltage VBB1 and negative voltage VBB2 must be adequately controlled between a normal operating mode and a test mode. Further, it is also desirable to reduce ripple by more efficiently controlling a negative drop voltage generator to appropriately generate a stabilized negative voltage in conformity with a selected operating mode.

It is also desirable to provide a technology where the bulk bias voltage VBB1 and the word line driving negative voltage VBB2 can be generated together or generated separately from each other, according to an operating mode (in response to a specific external signal).

SUMMARY OF THE INVENTION

Embodiments of the present invention relate to a semiconductor memory device including a negative drop voltage generating apparatus, which controls generation of a negative voltage. The negative drop voltage generating apparatus generates negative voltages at different levels, according to a memory test mode or normal operating mode. Other embodiments relate to a similar method of operating a negative drop voltage generating apparatus.

The negative drop voltage generating apparatus (of embodiments) may solve the problem of adjusting a voltage level of a word line driving negative voltage. In embodiments, the bulk bias voltage and the word line driving negative voltage are generated at different levels to obtain test reliability in a memory test mode and generated at the same level in a normal operating mode.

At least one negative drop voltage generating apparatus is employed, according to embodiments of the invention, to reduce ripple through more efficient control to generate a stabilized negative voltage according to the operating mode.

The bulk bias voltage and the word line driving negative voltage may be generated (in embodiments) together or separately from each other in conformity with an operating mode. This voltage generation may be in response to a specific external signal. This voltage generation may enhance memory test reliability and provide a stable level of negative voltage applied to a chip from a negative drop voltage generating apparatus.

Negative drop voltage generators may be employed (in embodiments) in a DRAM. In embodiments, negative drop voltage generators may be connectable or separable with/from each other using a mode register set (MRS). A negative voltage may be controlled more efficiently, because the negative drop voltage generators can be managed by a desired method.

In embodiments of the present invention, a negative drop voltage generating apparatus in a semiconductor memory device comprises a negative drop voltage generator having first and second output terminals and a voltage separated/integrated unit connected between the first and second output terminals. The voltage separated/integrated unit performs voltage separation and connection so that negative voltages are generated with individually different levels or with the same level through the first and second output terminals, in response to an applied control signal.

In embodiments of the present invention, a negative drop voltage generating apparatus in a semiconductor memory device comprises a first negative drop voltage generator (having a first output terminal) and a second negative drop voltage generator (having a second output terminal). The second negative drop voltage generator is connected to the first negative drop voltage generator through a voltage separated/integrated unit connected between the first and second output terminals. The voltage separated/integrated unit performs a voltage separation and connection, so that first and second negative voltages are generated with individually different levels or the same level through the first and second output terminals, in response to an applied control signal.

In accordance with embodiments of the present invention, a method controls generation of a negative voltage during a specific operating mode, in a semiconductor memory device having a negative drop voltage generator. The negative drop voltage generator has first and second output terminals. The method includes generating negative voltages with individually different levels through first and second output terminals, in response to a signal indicating the start of a specific operating mode. The method includes generating the negative voltages with the same level through the first and second output terminals, in response to a signal indicating the end of a specific operating mode.

In accordance with embodiments of the present invention, a method controls generation of a negative voltage during a specific operating mode, in a semiconductor memory device. The semiconductor memory device includes a first negative drop voltage generator (having a first output terminal) and a second negative drop voltage generator (having a second output terminal). The method includes generating negative voltages with different levels through the first and second output terminals, in response to a signal indicating the start of a specific operating mode. The method includes generating negative voltages at the same level through the first and second output terminals, in response to a signal indicating the specific operating mode.

The level of the negative voltage generated through the first output terminal may be lower than a level of the negative voltage generated through the second output terminal and may be applied to a bulk region where cell transistors of the semiconductor memory device are formed.

The signal indicating the entry of a specific operating mode may be a predetermined code signal applied through a mode register set in the test of semiconductor memory device.

BRIEF DESCRIPTION OF THE DRAWINGS

Example

Example

Example

DETAILED DESCRIPTION

Hereinafter, example embodiments of the present invention will be described in detail with reference to the accompanied drawings in which like components having like functions have been provided with like reference symbols and numerals. It will be understood by those skilled in the art that the present invention can be embodied by numerous different types and is not limited to the following described example embodiments. The following various embodiments are examples in nature.

Figure 1:
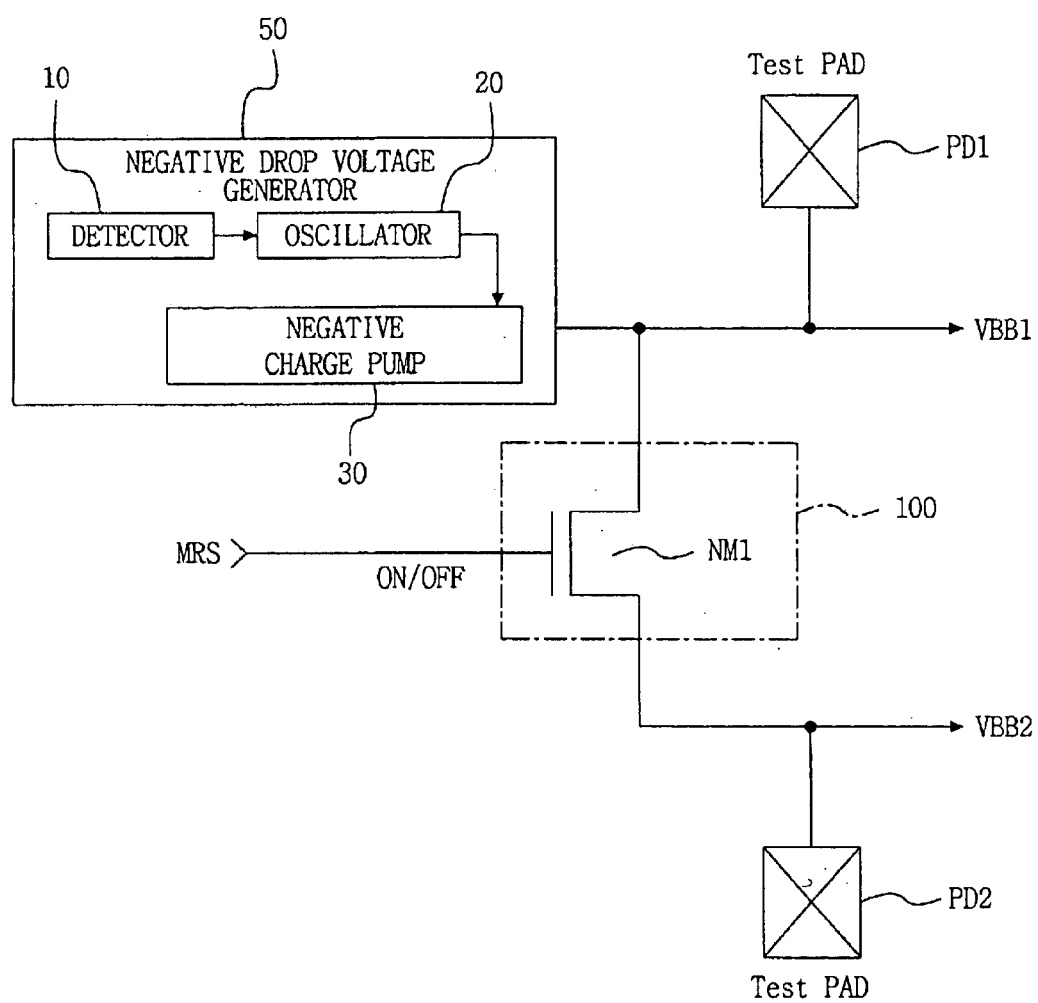
FIG. 1 is a block diagram of a negative drop voltage generating apparatus according to embodiments of the present invention.

FIG. 1 is a block diagram of negative drop voltage generating apparatus according to embodiments of the present invention. Referring to FIG. 1, the negative drop voltage generating apparatus includes a negative drop voltage generator 50 that has a first output terminal VBB1, a second output terminal VBB2, and an N-type MOS (Metal Oxide Semiconductor) transistor NM1. A drain-source channel of transistor NM1 is connected between the first output terminal VBB1 and the second output terminal VBB2 of the negative drop voltage generator 50. The transistor NM1 is turned on or off in response to an applied control signal MRS.

When the transistor NM1 is turned off, negative voltages are generated (with different voltage levels) through the first and second output terminals VBB1, VBB2. Through the first output terminal VBB1, the first negative voltage VBB1 is provided from a negative charge pump 30 of the negative drop voltage generator 50 or from a pad PD1. Through the second output terminal VBB2, the second negative voltage VBB2 is provided exclusively through the pad PD2.

Figure 3:
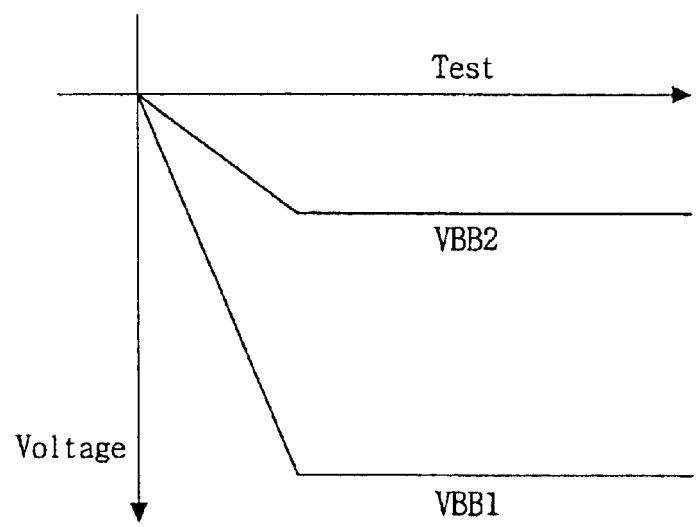

In a memory test mode, the transistor NM1 is turned off. As shown in FIG. 3, the generation level of the first and second negative voltages during a testing operation, the first negative voltage VBB1 is generated much lower than the second negative voltage VBB2. This level of voltage difference may be (in embodiments) to obtain test reliability.

Figure 2:
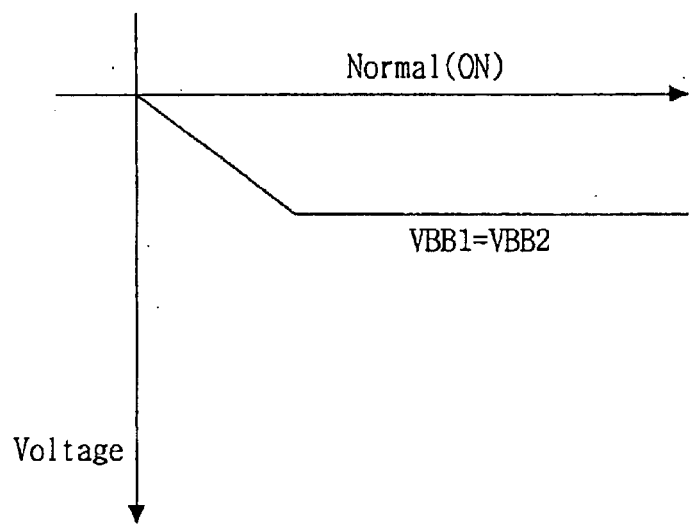
FIGS. 2 and 3 are graphs illustrating a generation level of first and second negative voltages in normal operation and test operation as applied to embodiments of the present invention.

When the transistor NM1 is turned on, the negative voltages are generated at the same level through the first and second output terminals VBB1, VBB2. When transistor NM1 is turned on, the first and second output terminals VBB1, VBB2 are electrically connected with each other through the transistor NM1. Accordingly, level of the first negative voltage VBB1 and the level of the second negative voltage VBB2 are equal. In a normal operation mode of the memory, the transistor NM1 may be turned on. As shown in the example of FIG. 2, in the a generation level of the first and second negative voltages (during a test operation) applied to the invention, the first negative voltage VBB1 and the second negative voltage VBB2 are generated at the same level.

In embodiments, a negative drop voltage generator 50 and a voltage separated/integrated unit 100 may generate stable and efficient negative voltages in conformity with an operating mode. The negative drop voltage generator 50 may include a detector 10, an oscillator 20, and a negative charge pump 30. The detector 10 may be for detecting a negative voltage received by feedback and outputs a detection signal that indicates a rise level or drop level of the negative voltage. The oscillator 20 may generate a pumping clock signal corresponding to the detection signal outputted from the detector 10. The charge pump 30 may perform a charge pumping operation in response to the pumping clock signal to output a negative voltage having a determined negative voltage level.

Figure 4:
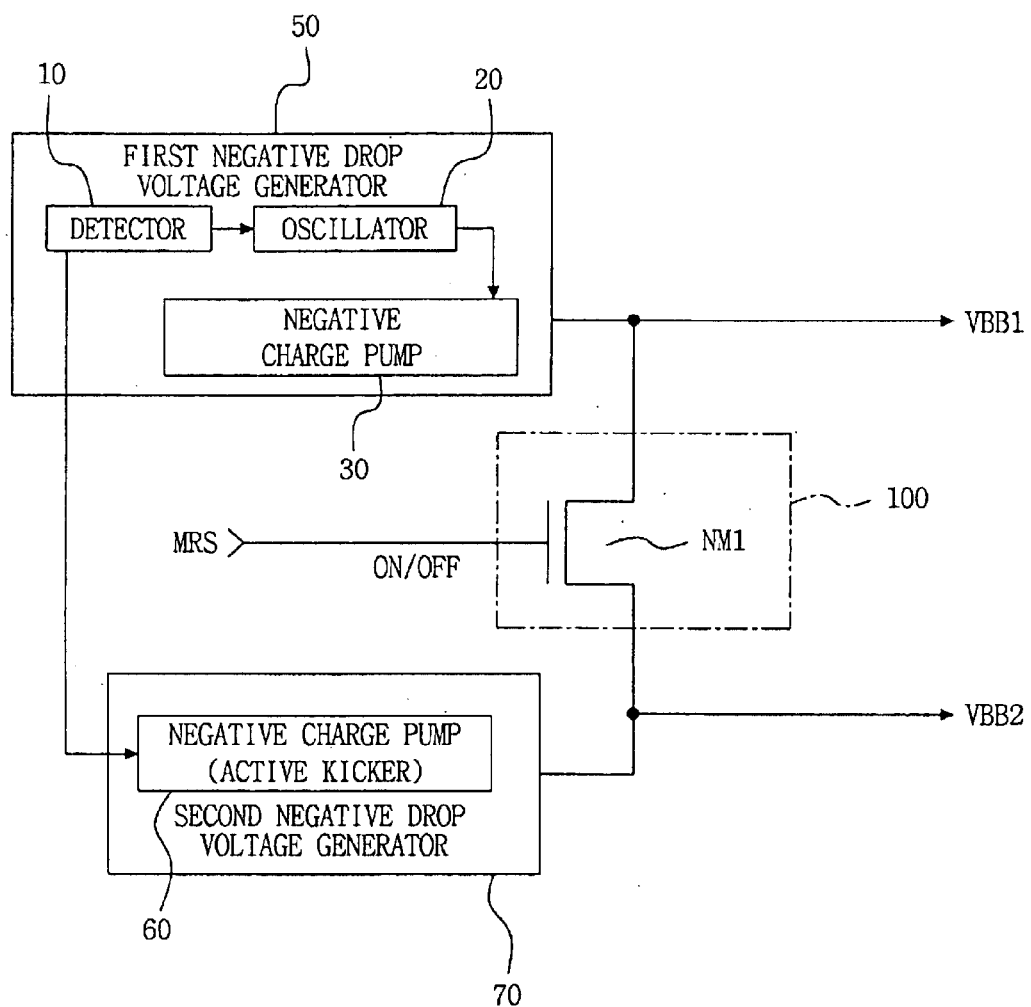
FIGS. 4 and 5 are block diagrams of a negative drop voltage generating apparatus, according to embodiments of the present invention.
Figure 5:
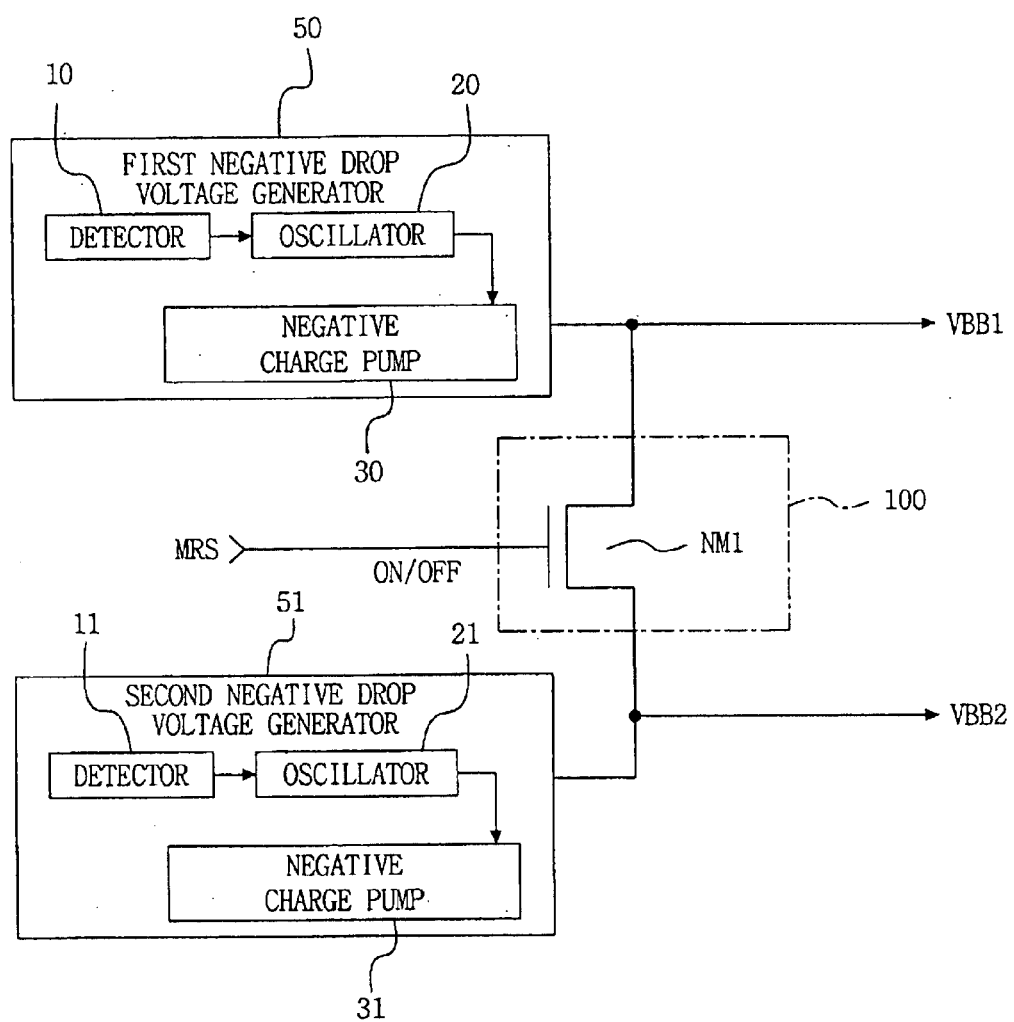

FIGS. 4 and 5 are block diagrams of the negative drop voltage generating apparatus, according to embodiments of the present invention. Referring to FIG. 4, the negative drop voltage generating apparatus includes a first negative drop voltage generator 50 (having a first output terminal VBB1), a second negative drop voltage generator 70 (connected to the first negative drop voltage generator 50 and having a second output terminal VBB2), and a voltage separated/integrated unit 100 connected between the first and second output terminals VBB1, VBB2 of the first and second negative drop voltage generators 50, 70. A charge pump 60 within the second negative drop voltage generator 70 is connected to the detector 10 of the first negative drop voltage generator 50. Accordingly, in a memory test mode for lowering the negative voltage VBB1 generated from the negative drop voltage generator 50 for use of a bulk bias, there is no problem with the negative voltage VBB2 being lower than a determined voltage level that is generated together in the negative drop voltage generator 70 for a driving a word line. The voltage separated/integrated unit 100 performs a voltage separation and connection, so that the first negative voltage VBB1 and the second negative voltage VBB2 are generated with individually different levels or with the same level through the first and second output terminals, in response to an applied control signal MRS. For example, if the voltage separated/integrated unit 100 performs a voltage separation operation in a memory test mode, the second negative voltage VBB2, that is higher than a level of the first negative voltage VBB1, can be provided through a negative voltage reception pad PD2 connected to the second output terminal VBB2.

In FIG. 4, there is no problem in generating negative voltages that are dropped together can be solved and the negative drop voltage generators are controlled in conformity with a desired method by connecting or separating between the negative drop voltage generators through use of the MRS (Mode Register Set). Therefore, the negative voltage can be managed effectively. In FIG. 4, when the N-type MOS transistor NM1 is turned off, the first and second negative voltages based on different levels are obtained, as shown in FIG. 3. When the N-type MOS transistor NM1 is turned on, the first and second negative voltages having the same level are obtained, as shown in FIG. 2.

FIG. 5 illustrates embodiments with a second negative drop voltage generator 51 that operates separately from a first negative drop voltage generator 50. The voltage separated/integrated unit 100 includes a N-type MOS transistor NM1 connected between the first output terminal VBB1 and the second output terminal VBB2 of the first and second negative drop voltage generators 50, 51. The negative drop voltage generators can be controlled in FIG. 5 through use of MRS. The negative drop voltage generators 50, 51 may be connected or separated to operate individually and independently. When the N-type MOS transistor NM1 is turned off, the first and second negative voltages may have different levels, as shown in FIG. 3. When the N-type MOS transistor NM1 is turned on, the first and second negative voltages may have the same level, as shown in FIG. 2.

In embodiments, accurate test coverage related to a refresh operation can be guaranteed in a memory test mode to enhance test reliability. In a normal operating mode, stability of negative voltages may be substantially guaranteed and ripple may be reduced by providing a negative voltage integrated as one voltage level.

In embodiments of the invention, signals are discriminated according to a test mode and a normal operating mode through employment of MRS. MRS may be a circuit device included in a DRAM chip, to perform a predetermined peculiar function. In embodiments, voltage separation and connection of the negative drop voltage generators are performed by using a code selected among unregulated codes, not by applying a regulated code as an outside input. Embodiments of the invention relate to programming a fuse or applying a voltage to a specific pad, which may be in addition to applying the MRS command from the outside.

According to embodiments of the invention, a voltage level of a word line driving negative voltage VBB2 is dropped together with the lowering of a bulk bias negative voltage VBB1. The bulk bias negative voltage VBB1 and the word line driving negative voltage VBB2 may be generated (in embodiments) with different levels in a memory test mode to obtain test reliability. Further, in a normal operating mode, the bulk bias negative voltage VBB1 and the word line driving negative voltage VBB2 are generated to the same level. The memory test reliability may be enhanced and a level of the negative voltage applied to a chip may be more stable. Ripple may be reduced (in embodiments) and a stabilized negative voltage may be generated appropriately for a given operating mode, by more efficient controlling of at least one negative drop voltage generator. The bulk bias negative voltage VBB1 and the word line driving negative voltage VBB2 may be generated together or separately, by applying a specific signal through use of MRS (Mode Register Set).

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, a detailed method or a detailed connection structure of circuit for a connection and separation operation of negative drop voltage generators can be varied diversely. Accordingly, these and other changes and modifications are seen to be within the true spirit and scope of the invention as defined by the appended claims.

What is claimed is:

1. A negative drop voltage generating apparatus in a semiconductor memory device, comprising:

a negative drop voltage generator comprising a first output terminal and a second output terminal; and a voltage separated/integrated unit connected between the first output terminal and the second output terminal of the negative drop voltage generator, wherein:

said voltage separated/integrated unit performs voltage separation or voltage connection depending on an applied control signal;

the first output terminal and the second output terminal output substantially the same voltage level if the voltage separated/integrated unit performs voltage connection; and the first output terminal and the second output terminal output different voltage levels if the voltage separated/integrated unit performs voltage separation.

2. The apparatus as claimed in claim 1, wherein the second output terminal is connected to a negative voltage reception pad.

3. The apparatus as claimed in claim 1, wherein the applied control signal is applied through a mode register set in testing the semiconductor memory device.

4. A negative drop voltage generating apparatus in a semiconductor memory device, comprising:

a first negative drop voltage generator comprising a first output terminal;

a second negative drop voltage generator comprising a second output terminal and connected to the first negative drop voltage generator; and a voltage separated/integrated unit connected between the first output terminal and the second output terminal, wherein:

said voltage separated/integrated unit performs voltage separation or voltage connection depending on an applied control signal;

the first output terminal and the second output terminal output substantially the same voltage level if the voltage separated/integrated unit performs voltage connection; and the first output terminal and the second output terminal output different voltage levels if the voltage separated/integrated unit performs voltage separation.

5. The apparatus as claimed in claim 4, wherein:

the second negative drop voltage generator shares a detector provided within the first negative drop voltage generator; and the second negative drop voltage generator generates a negative voltage higher than a level of negative voltage from the first negative drop voltage generator in a voltage separation operation.

6. The apparatus as claimed in claim 5, wherein the applied control signal is applied through a mode register set in testing the semiconductor memory device.

7. A negative drop voltage generating apparatus in a semiconductor memory device, comprising:

a first negative drop voltage generator having a first output terminal;

a second negative drop voltage generator having a second output terminal; and a voltage separated/integrated unit connected between the first output terminal and the second output terminal of the first and second negative drop voltage generators, wherein:

said voltage separated/integrated unit performs voltage separation or voltage connection depending on an applied control signal;

the first output terminal and the second output terminal output substantially the same voltage level if the voltage separated/integrated unit performs voltage connection; and the first output terminal and the second output terminal output different voltage levels if the voltage separated/integrated unit performs voltage separation.

8. The apparatus as claimed in claim 7, wherein:

the second negative drop voltage generator operates independently from the first negative drop voltage generator; and the second negative drop voltage generator generates a negative voltage higher than a level of a negative voltage from the first negative drop voltage generator.

9. The apparatus as claimed in claim 8, wherein the applied control signal is applied through a mode register set in testing the semiconductor memory device.

10. The apparatus as claimed in claim 7, wherein the applied control signal is applied through a mode register set in testing the semiconductor memory device.

11. A method of controlling negative voltage generation during a specific operating mode in a semiconductor memory device having a negative drop voltage generator which has first and second output terminals, said method comprising:

outputting different negative voltage levels from the first output terminal and the second output terminal, in response to a signal indicating the beginning of the specific operating mode; and outputting substantially the same negative voltage level from the first output terminal and the second output terminal, in response to a signal indicating the end of the specific operating mode.

12. The method as claimed in claim 11, wherein the negative voltage necessary for the specific operating mode is received through a negative voltage pad from the outside of the device and is applied to a bulk region where cell transistors of the semiconductor memory device are formed.

13. The method as claimed in claim 12, wherein the signal indicating the beginning of the specific operating mode is applied through a mode register set in testing the semiconductor memory device.

14. A method of controlling negative voltage generation during a specific operating mode in a semiconductor memory device which comprises a first negative drop voltage generator having a first output terminal and a second negative drop voltage generator having a second output terminal, said method comprising:

outputting different negative voltage levels from the first output terminal and the second output terminal, in response to a signal indicating the beginning of the specific operating mode; and outputting substantially the same negative voltage levels from the first output terminal and the second output terminal, in response to a signal indicating the end of the specific operating mode.

15. The method as claimed in claim 14, wherein a level of the negative voltage generated through the first output terminal is lower than a level of the negative voltage generated through the second output terminal and is applied to a bulk region where cell transistors of the semiconductor memory device are formed.

16. The method as claimed in claim 15, wherein the signal indicating the beginning of the specific operating mode is a predetermined code signal applied through a mode register set in testing the semiconductor memory device.

* * * * *